United States Patent
Wang et al.

(10) Patent No.: US 11,502,135 B2
(45) Date of Patent: Nov. 15, 2022

(54) DISPLAY SUBSTRATE, DISPLAY PANEL AND DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Yangpeng Wang, Beijing (CN); Chang Luo, Beijing (CN)

(73) Assignees: Chengdu BOE Optoelectronics Technology Co., Ltd., Sichuan (CN); Beijing BOE Technology Development Co., Ltd., Beijing (CN)

( * ) Notice: Subject to any disclaimer, the term of this patent is extended or adjusted under 35 U.S.C. 154(b) by 0 days.

(21) Appl. No.: 17/059,508

(22) PCT Filed: Mar. 27, 2020

(86) PCT No.: PCT/CN2020/081749
§ 371 (c)(1),
(2) Date: Nov. 30, 2020

(87) PCT Pub. No.: WO2020/228429
PCT Pub. Date: Nov. 19, 2020

(65) Prior Publication Data
US 2021/0210561 A1  Jul. 8, 2021

(30) Foreign Application Priority Data
May 16, 2019  (CN) .......................... 201910406651.3

(51) Int. Cl.
*H01L 27/32* (2006.01)

(52) U.S. Cl.
CPC ...... *H01L 27/3216* (2013.01); *H01L 27/3218* (2013.01)

(58) Field of Classification Search
CPC ................ H01L 27/3216–3218; H01L 27/326
See application file for complete search history.

(56) References Cited

U.S. PATENT DOCUMENTS

2005/0122036 A1  6/2005  Park et al.
2005/0247936 A1  11/2005  Bae et al.
(Continued)

FOREIGN PATENT DOCUMENTS

CN  101022124 A  8/2007
CN  108305891 A  7/2018
(Continued)

OTHER PUBLICATIONS

PCT International Search Report and Translation for corresponding PCT Application No. PCT/CN2020/081749, dated Jun. 30, 2020, 5 pages.
(Continued)

*Primary Examiner* — Eric K Ashbahian
(74) *Attorney, Agent, or Firm* — Dority & Manning, P.A.

(57) ABSTRACT

A display substrate, a display panel and a display device are provided. The display substrate has a plurality of sub-pixel regions and a plurality of inter-sub-pixel regions between the plurality of sub-pixel regions. The display substrate includes a plurality of sub-pixels located in the plurality of sub-pixel regions and at least one separation pillar, and at least one sub-pixel region is provided with at least one separation pillar therein.

18 Claims, 4 Drawing Sheets

(56) References Cited

U.S. PATENT DOCUMENTS

| | | | |
|---|---|---|---|
| 2006/0055313 | A1 | 3/2006 | Bae et al. |
| 2006/0081854 | A1 | 4/2006 | Kim et al. |
| 2008/0218061 | A1 | 9/2008 | Chao et al. |
| 2014/0332762 | A1 | 11/2014 | Kim et al. |
| 2014/0346478 | A1 | 11/2014 | Cho |
| 2015/0060809 | A1 | 3/2015 | Kim et al. |
| 2019/0237523 | A1* | 8/2019 | Zhai .................... H01L 27/3246 |
| 2019/0371874 | A1* | 12/2019 | Lee ..................... H01L 51/5206 |
| 2020/0152713 | A1* | 5/2020 | Yim .................... H01L 27/3218 |

FOREIGN PATENT DOCUMENTS

| | | |
|---|---|---|
| CN | 108832009 | 11/2018 |
| CN | 109148518 A | 1/2019 |
| CN | 109713014 A | 5/2019 |
| CN | 110047905 A | 7/2019 |
| JP | 2003059671 A | 2/2003 |
| JP | 2003243171 | 8/2003 |
| JP | 2005107294 A | 4/2005 |

OTHER PUBLICATIONS

Chinese First Office Action (w/ English translation) for corresponding CN Application No. 201910406651.3, 15 pages.
Chinese Second Office Action (w/ English translation) for corresponding CN Application No. 201910406651.3, 12 pages.
Chinese Third Office Action (w/ English translation) for corresponding CN Application No. 201910406651.3, 14 pages.

* cited by examiner

DISPLAY SUBSTRATE, DISPLAY PANEL AND DISPLAY DEVICE

CROSS-REFERENCE TO RELATED APPLICATIONS

This application is a national phase entry under 35 USC 371 of International Patent Application No. PCT/CN2020/081749 filed on Mar. 27, 2020, which claims priority to Chinese Patent Application No. 201910406651.3, filed on May 16, 2019, which are incorporated herein by reference in their entirety.

TECHNICAL FIELD

The present disclosure relates to the field of display technologies, and in particular, to a display substrate, a display panel and a display device.

BACKGROUND

Organic light-emitting diode (OLED) screens have received widespread attention due to their advantages such as lightness and thinness, flexibility, brilliant color, high contrast, and fast response rate, and become a representative of a next generation display technology. The light-emitting principle of an OLED screen is that pixels can emit light of different colors, and the brightness of the light of different colors is controlled to obtain the required light. In the related art, three primary colors, i.e., red, green and blue, are commonly used to obtain the required light. However, there are still many factors affecting the display quality of an image. At present, how to achieve a higher resolution and a better display effect has always been a research hotspot in the display field.

SUMMARY

An embodiment of the present disclosure provides a display substrate with good uniformity of visual angles, high resolution, a good display effect or a long service life.

In one aspect of the present disclosure, the present disclosure provides a display substrate. According to the embodiments of the present disclosure, the display substrate has a plurality of sub-pixel regions and a plurality of inter-sub-pixel regions between the plurality of sub-pixel regions, wherein the display substrate includes a plurality of sub-pixels located in the plurality of sub-pixel regions and at least one separation pillar, and at least one sub-pixel is provided with at least one separation pillar therein. Thus, compared with providing a separation pillar at a position between two adjacent sub-pixels, the display substrate of the embodiments of the present disclosure may improve the uniformity of viewing angles in different directions and reduce a distance between adjacent sub-pixels, which is conducive to improving an aperture rate and resolution of a display panel including the display substrate, thereby improving display effect of the display panel.

According to the embodiments of the present disclosure, in a sub-pixel, an orthographic projection of a light-emitting region on the display substrate surrounds an orthographic projection of at least one separation pillar on the display substrate.

According to the embodiments of the present disclosure, a geometric center of an orthographic projection of a separation pillar on the display substrate and a geometric center of the orthographic projection of a light-emitting region in the sub-pixel on the display substrate coincide.

According to the embodiments of the present disclosure, the display substrate includes a plurality of separation pillars, and the plurality of separation pillars are periodically arranged in the display substrate.

According to the embodiments of the present disclosure, a shape of an orthographic projection of each separation pillar on the display substrate is one or a combination of a circle, a polygon and an irregular shape.

According to the embodiments of the present disclosure, the display substrate includes a plurality of separation pillars, and 0 to 8 sub-pixels are disposed between two adjacent separation pillars.

According to the embodiments of the present disclosure, a maximum distance between any two points on a peripheral line of an orthographic projection of each separation pillar on the display substrate is approximately 1 to 10 microns.

According to the embodiments of the present disclosure, the display substrate further includes a base substrate disposed at a side of a sub-pixel, the sub-pixel includes a lower electrode, a light-emitting layer, and an upper electrode that are stacked in a direction away from the base substrate, at least one separation pillar is disposed at a side of the lower electrode away from the base substrate, and a portion where the light-emitting layer is in contact with the lower electrode is a light-emitting region is a light-emitting region.

According to the embodiments of the present disclosure, the display substrate further includes at least one insulating pillar. The at least one insulating pillar is disposed on a surface of the lower electrode away from the base substrate and penetrates the light-emitting layer and the upper electrode, and the at least one separation pillar is disposed on a surface of the at least one insulating pillar away from the base substrate.

According to the embodiments of the present disclosure, a cross section of one of at least one insulating pillar is trapezoidal, and/or, a cross section of one of at least one separation pillar is trapezoidal.

According to the embodiments of the present disclosure, the at least one separation pillar is disposed on a surface of the lower electrode away from the base substrate and penetrates the light-emitting layer and the upper electrode.

According to the embodiments of the present disclosure, a cross section of one of at least one separation pillar is trapezoidal.

According to the embodiments of the present disclosure, the at least one sub-pixel includes at least one first sub-pixel, at least one second sub-pixel, and at least one third sub-pixel.

According to the embodiments of the present disclosure, the at least one first sub-pixel includes first sub-pixels, the at least one second sub-pixel includes second sub-pixels, and the at least one third sub-pixel includes third sub-pixels; the first sub-pixels, the second sub-pixels, and the third sub-pixels are arranged in a way that; the display substrate has a plurality of virtual square regions, the first sub-pixels are arranged at vertexes of the square regions and at centers of the square regions, the second sub-pixels are each arranged at a midpoint of one of sides of square regions, and the third sub-pixels are each arranged at an intersection of a connection between two adjacent first sub-pixels and a connection between two adjacent second sub-pixels.

According to the embodiments of the present disclosure, the at least one first sub-pixel includes first sub-pixels, the at least one second sub-pixel includes second sub-pixels, and the at least one third sub-pixel includes third sub-pixels;

areas of the first sub-pixels are the same, and shapes of the first sub-pixels are the same; and/or, areas of the second sub-pixels are the same, and shapes of the second sub-pixels are the same; and/or, areas of the third sub-pixels are the same, and shapes of the third sub-pixels are the same.

According to the embodiments of the present disclosure, sides proximate to each other of any two adjacent sub-pixels are parallel.

According to the embodiments of the present disclosure, shapes of each first sub-pixel and each second sub-pixel are squares, angles between sides of the first sub-pixel and sides of a corresponding square region are 45 degrees, and angles between sides of the second sub-pixel and the sides of the corresponding square region are 45 degrees; and a shape of each third sub-pixel is a rectangle, and a long side of the third sub-pixel faces an adjacent second sub-pixel and is parallel to a side of the adjacent second sub-pixel.

According to the embodiments of the present disclosure, each first sub-pixel is a red sub-pixel, each second sub-pixel is a blue sub-pixel, and each third sub-pixel is a green sub-pixel; an area of the second sub-pixel is greater than an area of the first sub-pixel, and the area of the first sub-pixel is greater than an area of the third sub-pixel.

In another aspect of the present disclosure, the present disclosure provides a display panel. According to the embodiments of the present disclosure, the display panel includes the display substrate as described above. The display panel has better uniformity of light in each viewing angle, and may achieve higher resolution and a larger aperture rate, a better display effect, and a longer service life.

In yet another aspect of the present disclosure, the present disclosure provides a display device. According to the embodiments of the present disclosure, the display device includes the display panel as described above. The display device may achieve a higher aperture rate and higher resolution, a better display effect, and a longer service life.

REFERENCE NUMBERS

100: Display substrate; 120: Square region; 1: Sub-pixel; 10: First sub-pixel; 20: Second sub-pixel; 30: Third sub-pixel; 11: Orthographic projection of a light-emitting region on the display substrate; 21: Base substrate; 22: Active layer; 23: First insulating layer; 24: Gate; 25: Gate insulating layer; 26: Source; 27: Drain; 28: Second insulating layer; 200: Base; 31: Lower electrode; 32: Opening; 33: Light-emitting layer; 34: Upper electrode; 35: Pixel defining layer; 36: Insulating pillar; 37: Separation pillar; 371: Orthographic projection of the separation pillar on the display substrate.

DETAILED DESCRIPTION

The embodiments of the present disclosure will be described in detail below. The embodiments described below are exemplary, and are only used to explain the present disclosure, but should not be construed as limitations on the present disclosure. In the case where specific techniques or conditions are not indicated in the embodiments, the specific techniques or the conditions shall be obtained in accordance with techniques or conditions described in the literature in the field or in accordance with the product specification.

In one aspect of the present disclosure, a display substrate is provided. According to embodiments of the present disclosure, referring to FIGS. 1 and 2, the display substrate includes a plurality of sub-pixel regions and a plurality of inter-sub-pixel regions between the plurality of sub-pixel regions. The plurality of sub-pixel regions are provided with a plurality of sub-pixels. At least one sub-pixel is provided with at least one separation pillar 37 therein. Compared with providing a separation pillar at a position between two adjacent sub-pixels, the display substrate in the embodiments of the present disclosure may improve the uniformity of viewing angles in different directions and reduce a distance between adjacent sub-pixels, which is conducive to enhancing an aperture rate and resolution of a display panel including the display substrate, thereby improving display effect of the display panel.

According to embodiments of the present disclosure, in a sub-pixel, an orthographic projection of a light-emitting region on the display substrate surrounds an orthographic projection of at least one separation pillar on the display substrate. Compared with providing the separation pillar at the position between a sub-pixel and another sub-pixel, the display substrate in the embodiments of the present disclosure may improve the uniformity of light toward the separation pillar and toward other directions, thereby reducing a viewing angle difference during display and improving the problem of uneven viewing angle. In addition, since the separation pillar is disposed within the sub-pixel region in the embodiments of the present disclosure, a position of the separation pillar will not be taken into consideration when the light-emitting region defined by a pixel defining layer is set. Therefore, the light-emitting region may be further expanded to achieve a larger aperture rate.

Figure 1:
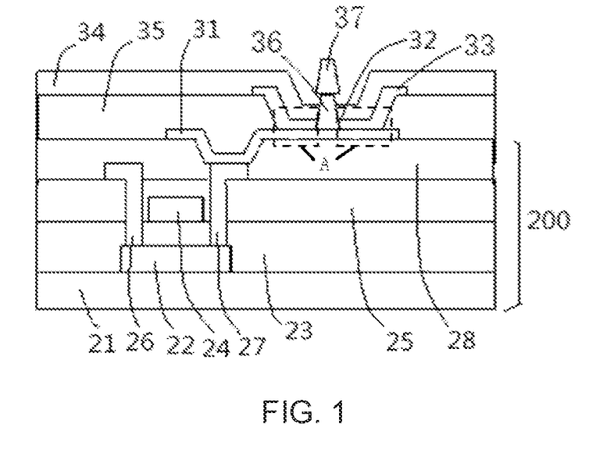
FIG. 1 is a schematic cross-sectional structural view of a display substrate, in accordance with an embodiment of the present disclosure.
Figure 2:
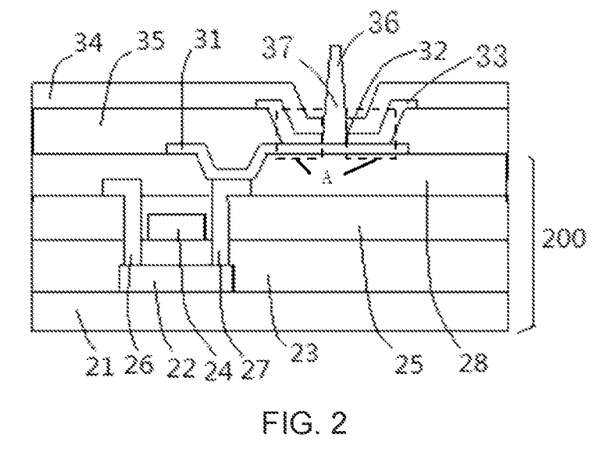
FIG. 2 is a schematic cross-sectional structural view of a display substrate, in accordance with another embodiment of the present disclosure.

As shown in FIGS. 1 and 2, a light-emitting region A refers to a region where a lower electrode 31 and a light-emitting layer 33 are in contact in the display substrate.

Generally, an area of the lower electrode is larger than the contact region mentioned above.

Figure 3:
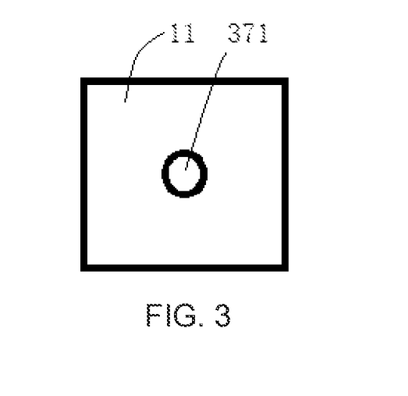
FIG. 3 is a schematic diagram of orthographic projections of a light-emitting region and a separation pillar in a sub-pixel on a display substrate, in accordance with an embodiment of the present disclosure.
Figure 4:
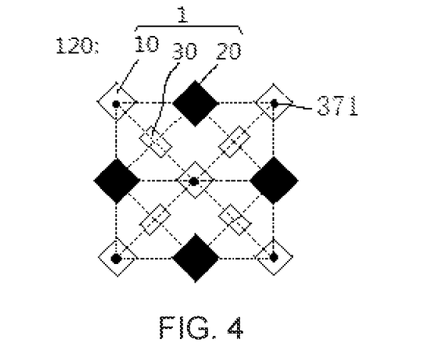
FIG. 4 is a schematic plan view of a structure of an arrangement of separation pillars in a display substrate, in accordance with an embodiment of the present disclosure.
Figure 5:
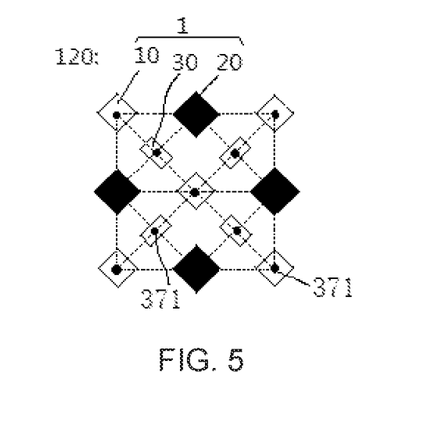
FIG. 5 is a schematic plan view of a structure of an arrangement of separation pillars in a display substrate, in accordance with another embodiment of the present disclosure.
Figure 6:
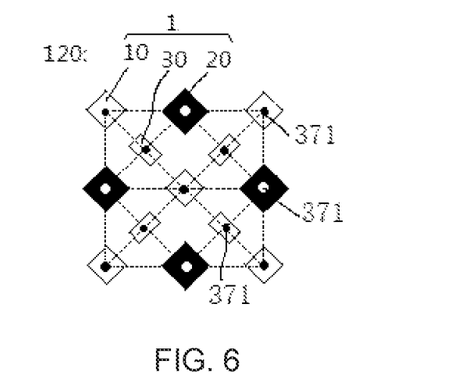
FIG. 6 is a schematic plan view of a structure of an arrangement of separation pillars in a display substrate, in accordance with yet another embodiment of the present disclosure.
Figure 7:
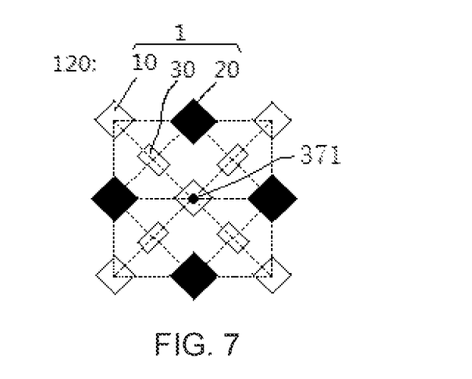
FIG. 7 is a schematic plan view of a structure of an arrangement of separation pillars in a display substrate, in accordance with yet another embodiment of the present disclosure.

According to embodiments of the present disclosure, in order to further improve the uniformity of viewing angles, a geometric center of the orthographic projection of the separation pillar on the display substrate coincides with a geometric center of the orthographic projection of the light-emitting region in the sub-pixel on the display substrate. In some specific embodiments, referring to FIG. 3, taking a shape of a peripheral line of the orthographic projection 11 of the light-emitting region in the sub-pixel on the display substrate being a square, and a shape of the orthographic projection 371 of the separation pillar 37 on the display substrate being a circle as an example, a geometric center of the square and a geometric center of the circle (i.e., a center of the circle) coincide. Based on this, the light-emitting region and the separation pillar in the sub-pixel each have a symmetrical structure, and thus the display effect is better.

According to embodiments of the present disclosure, the specific distribution of the separation pillar(s) in the display substrate is not particularly limited, and may be flexibly selected according to actual needs. In some specific embodiments, in order to make the light more uniform, the display substrate includes a plurality of separation pillars, and the plurality of separation pillars are periodically arranged in the display substrate.

In some embodiments of the present disclosure, the display substrate includes separation pillar(s) disposed in the sub-pixel and separation pillar(s) disposed in the inter-sub-pixel region.

It can be understood by a person skilled in the art that, sub-pixels of different colors are arranged in the display substrate according to a predetermined manner. Referring to FIGS. 4 to 7, the specific distribution of the separation pillars will be described by taking the sub-pixels 1 including first sub-pixels 10, second sub-pixels 20 and third sub-pixels 30 that have different colors as an example. All the first sub-pixels 10 may be provided with the separation pillars (referring to FIG. 4); all the second sub-pixels 20 may be provided with the separation pillars; or all the third sub-pixels 30 may be provided with the separation pillars. Or, all the first sub-pixels 10 and all the second sub-pixels 20 may be provided with the separation pillars; all the first sub-pixels 10 and all the third sub-pixels 30 may be provided with the separation pillars (referring to FIG. 5); or all the third sub-pixels 30 and all the second sub-pixels 20 may be provided with the separation pillars. Or, all the first sub-pixels 10, all the second sub-pixels 20, and all the third sub-pixels 30 may be provided with the separation pillars (referring to FIG. 6). Or, some first sub-pixels 10 may be provided with the separation pillars (referring to FIG. 7); some second sub-pixels 20 may be provided with the separation pillars; some third sub-pixels 30 may be provided with the separation pillars; some first sub-pixels 10 and some second sub-pixels 20 may be provided with the separation pillars; some first sub-pixels 10 and some third sub-pixels 30 may be provided with the separation pillars; some third sub-pixels 30 and some second sub-pixels 20 may be provided with the separation pillars; or some first sub-pixels 10, some second sub-pixels 20 and some third sub-pixels 30 may be provided with the separation pillars.

According to embodiments of the present disclosure, 0 to 8 sub-pixels may be provided between two adjacent separation pillars, such as 0 (that is, both the two adjacent sub-pixels are provided with a separation pillar), 1, 2, 3, 4, 5, 6, 7, or 8. In this way, a good supporting function may be achieved. According to embodiments of the present disclosure, since a size of the separation pillar may be relatively small in a case where the separation pillars are provided in the sub-pixels, compared with a case where the separation pillars are provided between the sub-pixels, a relatively large aperture rate may be achieved. A maximum distance between any two points on the peripheral line of the orthographic projection of the separation pillar on the display substrate is approximately 1 to 10 microns (e.g., 1 micron, 2 microns, 3 microns, 4 microns, 5 microns, 6 microns, 7 microns, 8 microns, 9 microns, or 10 microns). It can be understood that, in one hand, for the sake of increasing the aperture rate, the smaller an area of the orthographic projection of the separation pillar on the display substrate, and the smaller a distribution density of the separation columns, the better. In another hand, for the sake of achieving a better supporting function, the larger the area of the orthographic projection of the separation pillar on the substrate, and the greater the distribution density of the separation pillars, the better. In practical applications, the above factors may be considered comprehensively, and under the premise of ensuring the supporting function, the area of the orthographic projection of the separation pillar on the display substrate and the distribution density of the separation pillars may be reduced as much as possible, so as to increase the aperture rate.

It will be noted that, "approximately" herein refers to values within a range of process error and measurement error that allowed without strict numerical limits.

According to the embodiments of the present disclosure, a specific shape of the orthographic projection of the at least one separation pillar on the display substrate is not limited, and may include but be not limited to one or more of a circle, a polygon, or an irregular shape. The polygon may be a square, a rectangle, a triangle, a pentagon, a hexagon, etc. The irregularly shape may have sides of straight lines, a combination of straight lines and curves, curves, polylines, etc. Areas of the orthographic projections of the separation pillars in different sub-pixels on the display substrate may be same, which may further improve the uniformity of the light emitted by the display panel including the display substrate, thereby improving the display quality of the display panel.

According to the embodiments of the present disclosure, the display substrate further includes a base substrate disposed at a side of a sub-pixel, and the sub-pixel includes a lower electrode, a light-emitting layer, and an upper electrode that are stacked in a direction away from the base substrate. The separation pillar may be disposed at a side of the lower electrode away from the base substrate. In some specific embodiments, referring to FIG. 1, the display substrate further includes at least one insulating pillar 36. The at least one insulating pillar 36 is disposed on a surface of the lower electrode 31 away from the base substrate 21 and penetrates the light-emitting layer 33 and the upper electrode 34, and the at least one separation pillar 37 is disposed on a surface of the at least one insulating pillar 36 away from the base substrate 21. A portion where the light-emitting layer is in contact with the lower electrode is the light-emitting region. The insulating pillar 36 and the separation pillar 37 are jointed together, but are two separate structures. In some embodiments, a cross section of the insulating pillar 36 is trapezoidal, and/or, a cross section of the separation pillar 37 is trapezoidal.

In some other specific embodiments, referring to FIG. 2, the separation pillar 37 is disposed on the surface of the lower electrode 31 away from the base substrate 21 and penetrates the light-emitting layer 33 and the upper electrode 34. The insulating pillar 36 and the separation pillar 37 are formed integrally. In some embodiments, a cross section of an entirety of the insulating pillar 36 and the separation pillar 37 is trapezoidal.

According to the embodiments of the present disclosure, the specific arrangement of the plurality of sub-pixels in the display substrate is not particularly limited, and may be any conventional arrangement of the sub-pixels in the display substrate. In an example in which the sub-pixels of three different colors included in the sub-pixels are the first sub-pixels, the second sub-pixels and the third sub-pixels, the first sub-pixels, the second sub-pixels, and the third sub-pixels may be alternately arranged in sequence in rows or in columns. In some specific embodiments of the present disclosure, referring to FIGS. 8 and 9, the display substrate 100 has a plurality of virtual square regions 120. The first sub-pixels 10 are arranged at vertexes of the square regions and at centers of the square regions, the second sub-pixels 20 are each arranged at a midpoint of sides of the square regions, and the third sub-pixels 30 are arranged at intersections, each of which is an intersection of a connection between two adjacent first sub-pixels 10 and a connection between two adjacent second sub-pixels 20. Such a pixel arrangement may achieve a high space utilization rate and high resolution. Therefore, different sub-pixels may better coordinate to emit light, and the display effect of the display panel including the display substrate may become better.

Figure 8:
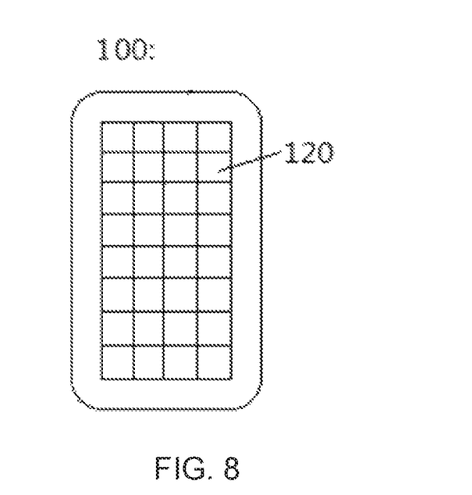
FIG. 8 is a schematic plan view of a structure of a display substrate, in accordance with another embodiment of the present disclosure.
Figure 9:
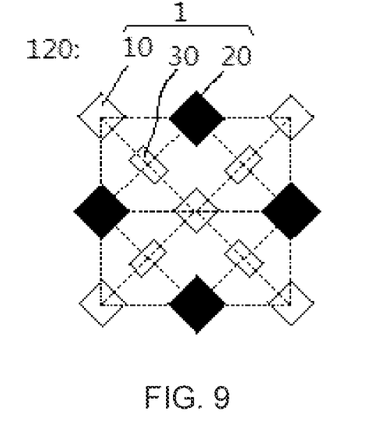
FIG. 9 is a schematic plan view of a structure of an arrangement of separation pillars in a display substrate, in accordance with another embodiment of the present disclosure.

According to the embodiments of the present disclosure, areas of the first sub-pixels 10 are the same, and shapes of the first sub-pixels 10 are the same. And/or, areas of the second sub-pixels 20 are the same, and shapes of the second sub-pixels are the same. And/or, areas of the third sub-pixels 30 are the same, and shapes of the third sub-pixels are the same. Therefore, the uniformity of light emitted from various positions of the display panel may be better, and the display effect may be better.

In some specific embodiments, in order to better improve the space utilization rate, the sides proximate to each other of any two adjacent sub-pixels are parallel to each other. It will be noted that, the two sides being parallel to each other described herein should be interpreted broadly, so long as a distance between the two sides at any positions on the two sides is the same. That is, the following cases are included, Two straight sides are parallel to each other; or, two sides are curves, polylines, or each side is a combination of curves and straight lines, and the distance between the two sides at any positions is the same. As a result, the arrangement of the sub-pixels is relatively regular, which may significantly improve the space utilization rate, and avoid the problem that much space between adjacent sub-pixels cannot be effectively utilized, thereby achieving higher resolution and a better display effect.

According to some specific embodiments of the present disclosure, referring to FIG. 9, the shapes of the first sub-pixel 10 and the second sub-pixel 20 are squares, angles between the sides of the first sub-pixel 10 and the sides of the square region 120 are 45 degrees, and angles between the sides of the second sub-pixel 20 and the sides of the square region 120 are 45 degrees. A shape of the third sub-pixel 30 is a rectangle, and a long side of the third sub-pixel 30 faces the second sub-pixel 20 and is parallel to a side of the adjacent second sub-pixel. As a result, the space utilization rate may be higher, and different sub-pixels may better coordinate to emit light, so as to achieve a better display effect and a longer service life.

According to embodiments of the present disclosure, the first sub-pixel is a red sub-pixel, the second sub-pixel is a blue sub-pixel, and the third sub-pixel is a green sub-pixel. Moreover, an area of the second sub-pixel is greater than an area of the first sub-pixel, and the area of the first sub-pixel is greater than an area of the third sub-pixel. Generally, a green light-emitting material has high brightness and a long service life, a blue light-emitting material has low brightness and a short service life, and brightness and a service life of a red light-emitting material are in the middle. The above pixel arrangement may well balance the brightness and the service life of the blue sub-pixel, the green sub-pixel and the red sub-pixel, and make the display panel including the display substrate have a better display effect and a longer service life.

According to embodiments of the present disclosure, in order to facilitate processing and improve the space utilization rate, the distance between any two adjacent sub-pixels may be approximately 10 to 20 microns, such as 1 micron, 2 microns, 3 microns, 4 microns, 5 microns, 6 microns, 7 microns, 8 microns, 9 microns, 10 microns, 11 microns, 12 microns, 13 microns, 14 microns, 15 microns, 16 microns, 17 microns, 18 microns, 19 microns, or 20 microns. Within the range of this distance, not only the process requirements may be met, but also the spacing between adjacent sub-pixels may be smaller, and the space utilization rate may be higher.

It can be understood by a person skilled in the art that, in addition to the structures described above, the display substrate may further include structures and components that are essential for a conventional display substrate. For example, the display substrate may include the base substrate, and thin film transistors (TFTs) and light-emitting components that are disposed on the base substrate, which will not be elaborated herein.

It can be understood by a person skilled in the art that, each sub-pixel usually includes the lower electrode, the light-emitting layer, and the upper electrode that are stacked. On this basic, the process of forming the sub-pixel may include the steps of forming the lower electrode, the light-emitting layer, and the upper electrode. In the display substrate, at least one sub-pixel is formed by the following steps: forming the lower electrode on a base; forming the light-emitting layer on a surface of the lower electrode away from the base; forming the upper electrode on a surface of the light-emitting layer away from the base; and forming an opening, the opening penetrating the upper electrode or penetrating the upper electrode and the light-emitting layer, and an orthographic projection of the opening on the display substrate being located in an orthographic projection of the light-emitting layer on the display substrate. This method is simple, convenient, easy to implement, and beneficial to industrialized production.

According to embodiments of the present disclosure, the base may include the base substrate, and a circuit structure (including the thin film transistors) and necessary insulating layers (such as a gate insulating layer, and an interlayer insulating layer) that are disposed on the base substrate. Specifically, with reference to FIGS. 1 and 2, the base 200 may specifically include the base substrate 21, an active layer 22 disposed on a side of the base substrate, a first insulating layer 23 disposed on the side of the base substrate and covering the active layer, a gate 24 disposed on a side of the first insulating layer away from the base substrate, a gate insulating layer 25 disposed on a side of the first insulating layer away from the base substrate and covering the gate, a source 26 and a drain 27 that are disposed on a side of the gate insulating layer away from the base substrate and electrically connected to the active layer respectively through via holes, and a second insulating layer 28 disposed on the side of the gate insulating layer away from the base substrate and covering the source and the drain.

According to embodiments of the present disclosure, a specific method for forming the upper electrode and the lower electrode includes, but is not limited to physical vapor deposition or chemical vapor deposition, and a specific method for forming the light-emitting layer includes, but is not limited to vacuum evaporation or inkjet printing. The specific operation steps and parameters may be selected according to actual needs.

According to embodiments of the present disclosure, there are no restrictions on the specific steps for forming the opening. For example, the steps for forming the opening include, but are not limited to, photoetching; or forming a placeholder component at a corresponding position first, and then forming the upper electrode or forming the upper electrode and the light-emitting layer. The position occupied by the placeholder component is the opening, and the placeholder component may be removed or directly filled in the opening in the follow-up step. In addition, the order of the steps for forming the opening is not particularly limited. After the lower electrode, the light-emitting layer, and the upper electrode are formed separately, a portion of the light-emitting layer and a portion of the upper electrode may be respectively removed to form the opening (for example, the light-emitting layer is formed and a portion of the light-emitting layer is removed, and then the upper electrode is formed and a portion of the upper electrode is removed). Alternatively, after the lower electrode, the light-emitting layer and the upper electrode are formed, a portion thereof is removed in one step to form the opening (for example, the lower electrode, the light-emitting layer and the upper electrode are formed sequentially, and then a portion of the upper electrode and the light-emitting layer is removed). Alternatively, the placeholder component can be used to form the opening.

According to some other embodiments of the present disclosure, at least one sub-pixel is formed by the following steps: forming the lower electrode 31 on a base 200; forming the insulating pillar 36 in the middle of a surface of the lower electrode 31 away from the base 200; forming the light-emitting layer 33 on the surface of the lower electrode 31 away from the base 200; and forming the upper electrode 34 on a surface of the light-emitting layer 33 away from the base 200, wherein the insulating pillar 36 penetrates the light-emitting layer 33 and the upper electrode 34, so as to form the opening 32 in the middle of the light-emitting layer 33 and the upper electrode 34; and then forming the separation pillar 37 on a surface of the insulating pillar 36 away from the base 200. A schematic structural diagram of a product obtained is shown in FIG. 1. A person skilled in the art may understand that, the insulating pillar 36 is the placeholder component.

According to embodiments of the present disclosure, the insulating pillar 36 and the pixel defining layer 35 of the display substrate may be formed through a single patterning process. Specifically, an insulating layer may be formed first, and then the insulating layer is patterned through a photoetching process (including steps of photoresist coating—exposure—development—etching) to obtain the pixel defining layer 35 and the insulating pillar 36 in one step. In this way, operation steps may be reduced, costs may be reduced, and operability may be improved.

According to some other embodiments of the present disclosure, referring to FIG. 2, the separation pillar 37 may be directly disposed on the surface of the lower electrode 31 away from the base 200, and the separation pillar 37 penetrates the light-emitting layer 33 and the upper electrode 34. In this case, the separation pillar 37 and the pixel defining layer of the display substrate may be formed through a single patterning process by using a halftone mask. Specifically, an insulating layer may be formed first, then a photoresist layer may be formed on a surface of the insulating layer away from the base, and then the photoresist layer is exposed by using the half-tone mask. After the photoresist layer is developed, a portion of the photoresist layer at a position for forming the light-emitting layer is removed, and a thickness of a portion of the photoresist layer at a position for forming the pixel defining layer is reduced, whereas a portion of the photoresist layer at a position for forming the separation pillar is unchanged. Then, the exposed insulating layer is etched to form the opening for forming the light-emitting layer. And then the remaining photoresist layer is exposed again. After the remaining photoresist layer is developed, a portion of the remaining photoresist layer at a position for forming the pixel defining layer is removed, whereas a portion of the remaining photoresist layer at a position for forming the separation pillar is unchanged. And then the exposed insulating layer is etched again to form the pixel defining layer, and a remaining photoresist layer is removed.

In another aspect of the present disclosure, a display panel is provided. According to embodiments of the present disclosure, the display panel includes the display substrate as described above. The display panel has better uniformity of light in each viewing angle, and may achieve higher resolution and a larger aperture rate, a better display effect, and a longer service life.

It can be understood that, in addition to the above display substrate, the display panel further includes structures and components that are essential for a conventional display panel, such as an encapsulation structure and a cover plate, which will not be elaborated herein.

In yet another aspect of the present disclosure, a display device is provided. According to embodiments of the present disclosure, the display device includes the display panel as described above. The display device may achieve a higher aperture rate and higher resolution, a better display effect, and a longer service life.

It can be understood by a person skilled in the art that, the specific type of the display device is not particularly limited, and may be any display device known in the art. For example, the display device can include but be not limited to a mobile phone, a television, a display, a tablet computer, a wearable device, a game console, and a display panel of any electrical appliance. In addition, it can be understood that, in addition to the above display panel, the display device may further include other structures and components that are essential for a conventional display device. Taking a mobile phone as an example, the display device may further include a touch screen, a housing, a CPU, a fingerprint identification module, a camera module, a sound system, a battery, etc., which will not be repeated herein.

In the description, terms such as "one embodiment", "some embodiments", "example", "specific example", or "some examples" are intended to indicate that specific features, structures, materials or characteristics related to the embodiment(s) or example(s) are included in at least one embodiment or example of the present disclosure. In the description, schematic representations of the above terms do not necessarily refer to the same embodiment(s) or example(s). Specific features, structures, materials or characteristics may be combined in any suitable manner in any one or more embodiments or examples. In addition, a person skilled in the art may combine different embodiments or examples and the features of the different embodiments or examples described in the description without contradicting each other.

Although the embodiments of the present disclosure have been shown and described above, it will be understood that, the above embodiments are exemplary and should not be construed as limitations on the present disclosure. A person of ordinary skill in the art may change, amend, substitute and modify the above embodiments within the scope of the present disclosure.

What is claimed is:

1. A display substrate, having a plurality of sub-pixel regions and a plurality of inter-sub-pixel regions between the plurality of sub-pixel regions, wherein the display substrate comprises a plurality of sub-pixels located in the plurality of sub-pixel regions and at least one separation pillar, and at least one sub-pixel is provided with at least one separation pillar therein:
the display substrate further comprises a base substrate disposed at a side of a sub-pixel, the sub-pixel includes a lower electrode, a light-emitting layer, and an upper electrode that are stacked in a direction away from the base substrate, at least one separation pillar is disposed at a side of the lower electrode away from the base substrate, and a portion where the light-emitting layer is in contact with the lower electrode is a light-emitting region; and
the at least one separation pillar is disposed on a surface of the lower electrode away from the base substrate and penetrates the light-emitting layer and the upper electrode.

2. The display substrate according to claim 1, wherein in a sub-pixel, an orthographic projection of a light-emitting region on the base substrate surrounds an orthographic projection of at least one separation pillar on the base substrate.

3. The display substrate according to claim 1, wherein a geometric center of an orthographic projection of a separation pillar on the base substrate and a geometric center of an orthographic projection of a light-emitting region on the base substrate coincide.

4. The display substrate according to claim 1, wherein the display substrate comprises a plurality of separation pillars, and the plurality of separation pillars are periodically arranged in the display substrate.

5. The display substrate according to claim 1, wherein a shape of an orthographic projection of each separation pillar on the base substrate is one or a combination of a circle, a polygon and an irregular shape.

6. The display substrate according to claim 1, wherein the display substrate comprises a plurality of separation pillars, and 0 to 8 sub-pixels are disposed between two adjacent separation pillars.

7. The display substrate according to claim 1, wherein a maximum distance between any two points on a peripheral line of an orthographic projection of each separation pillar on the base substrate is approximately 1 to 10 microns.

8. The display substrate according to claim 1, wherein a cross section of one of at least one separation pillar is trapezoidal.

9. The display substrate according to claim 1, wherein the at least one sub-pixel includes at least one first sub-pixel, at least one second sub-pixel, and at least one third sub-pixel.

10. The display substrate according to claim 9, wherein the at least one first sub-pixel includes first sub-pixels, the at least one second sub-pixel includes second sub-pixels, and the at least one third sub-pixel includes third sub-pixels; the first sub-pixels, the second sub-pixels, and the third sub-pixels are arranged in a way that:
the display substrate has a plurality of virtual square regions, the first sub-pixels are arranged at vertexes of the square regions and at centers of the square regions, the second sub-pixels are each arranged at a midpoint of one of sides of square regions, and the third sub-pixels are each arranged at an intersection of a connection between two adjacent first sub-pixels and a connection between two adjacent second sub-pixels.

11. The display substrate according to claim 9, wherein the at least one first sub-pixel includes first sub-pixels, the at least one second sub-pixel includes second sub-pixels, and the at least one third sub-pixel includes third sub-pixels;
areas of the first sub-pixels are the same, and shapes of the first sub-pixels are the same; and/or, areas of the second sub-pixels are the same, and shapes of the second sub-pixels are the same; and/or, areas of the third sub-pixels are the same, and shapes of the third sub-pixels are the same.

12. The display substrate according to claim 10, wherein sides proximate to each other of any two adjacent sub-pixels are parallel.

13. The display substrate according to claim 10, wherein shapes of each first sub-pixel and each second sub-pixel are squares, angles between sides of the first sub-pixel and sides of a corresponding square region are 45 degrees, and angles between sides of the second sub-pixel and the sides of the corresponding square region are 45 degrees; and a shape of each third sub-pixel is a rectangle, and a long side of the third sub-pixel faces an adjacent second sub-pixel and is parallel to a side of the adjacent second sub-pixel.

14. The display substrate according to claim 9, wherein each first sub-pixel is a red sub-pixel, each second sub-pixel is a blue sub-pixel, and each third sub-pixel is a green sub-pixel; an area of the second sub-pixel is greater than an area of the first sub-pixel, and the area of the first sub-pixel is greater than an area of the third sub-pixel.

15. A display panel, comprising the display substrate according to claim 1.

16. A display device, characterized by comprising the display panel according to claim 15.

17. A display substrate, having a plurality of sub-pixel regions and a plurality of inter-sub-pixel regions between the plurality of sub-pixel regions, wherein the display substrate comprises a plurality of sub-pixels located in the plurality of sub-pixel regions and at least one separation pillar, and at least one sub-pixel is provided with at least one separation pillar therein;
the display substrate further comprises a base substrate disposed at a side of a sub-pixel, the sub-pixel includes a lower electrode, a light-emitting layer, and an upper electrode that are stacked in a direction away from the base substrate, at least one separation pillar is disposed at a side of the lower electrode away from the base substrate, and a portion where the light-emitting layer is in contact with the lower electrode is a light-emitting region; and
the display substrate further comprises at least one insulating pillar, the at least one insulating pillar is disposed on a surface of the lower electrode away from the base substrate and penetrates the light-emitting layer and the upper electrode, and the at least one separation pillar is disposed on a surface of the at least one insulating pillar away from the base substrate.

18. The display substrate according to claim 17, wherein a cross section of one of at least one insulating pillar is trapezoidal, and/or, a cross section of one of at least one separation pillar is trapezoidal.

\* \* \* \* \*